(12) United States Patent
Harima et al.

(10) Patent No.: US 8,031,023 B2
(45) Date of Patent: Oct. 4, 2011

(54) CRYSTAL OSCILLATOR FOR SURFACE MOUNTING

(75) Inventors: Hidenori Harima, Sayama (JP); Kouichi Moriya, Sayama (JP)

(73) Assignee: Nihon Dempa Kogyo Co., Ltd., Tokyo (JP)

(*) Notice: Subject to any disclaimer, the term of this patent is extended or adjusted under 35 U.S.C. 154(b) by 50 days.

(21) Appl. No.: 12/596,916

(22) PCT Filed: Apr. 24, 2008

(86) PCT No.: PCT/JP2008/057901
§ 371 (c)(1),
(2), (4) Date: Oct. 21, 2009

(87) PCT Pub. No.: WO2008/136340
PCT Pub. Date: Nov. 13, 2008

(65) Prior Publication Data
US 2010/0060367 A1    Mar. 11, 2010

(30) Foreign Application Priority Data
Apr. 26, 2007  (JP) .................................. 2007-116989

(51) Int. Cl.
*H03B 5/08* (2006.01)
(52) U.S. Cl. ................ 331/168; 331/107 R; 331/108 C; 331/116 R; 331/154; 331/158
(58) Field of Classification Search .................... 331/68, 331/10 R, 116 R, 108 C, 154, 158, 163
See application file for complete search history.

(56) References Cited

U.S. PATENT DOCUMENTS
2006/0139115 A1* 6/2006 Mizumura et al. ............ 331/176
2009/0195323 A1* 8/2009 Harima ........................ 331/68

FOREIGN PATENT DOCUMENTS
JP 2000-49560 A 2/2000
JP 2003-163542 A 6/2003
JP 2006-129187 A 5/2006

* cited by examiner

*Primary Examiner* — Joseph Chang
*Assistant Examiner* — Jeffrey Shin
(74) *Attorney, Agent, or Firm* — Knobbe, Martens, Olson & Bear, LLP

(57) ABSTRACT

The crystal oscillator for surface mounting includes: a container body having first and second recesses on both principal surfaces thereof; a crystal blank hermetically encapsulated within the first recess; and an IC chip in which an oscillation circuit using the crystal blank is integrated, the IC chip being accommodated within the second recess. The IC chip is provided with a plurality of IC terminals including a pair of crystal terminals used for electrical connection with the crystal blank. A plurality of mounting electrodes to which the IC terminals are connected through flip-chip bonding are formed on a bottom surface of the second recess in correspondence with the IC terminals. A pair of mounting electrodes corresponding to the pair of crystal terminals are electrically connected to the crystal blank and also formed as a pair of dual-purpose electrodes having greater areas than the other mounting electrodes.

4 Claims, 5 Drawing Sheets

CRYSTAL OSCILLATOR FOR SURFACE MOUNTING

This application is the U.S. National Phase under 35. U.S.C. §371 of International Application PCT/JP2008/057901, filed Apr. 24, 2008, which claims priority to Japanese Patent Application No. 2007-116989, filed Apr. 26, 2007. The International Application was published under PCT Article 21(2) in a language other than English.

TECHNICAL FIELD

The present invention relates to a quartz crystal oscillator for surface mounting using a container body, on both principal surfaces of which recesses are formed, and accommodating a quartz crystal blank and an IC chip, which integrates an oscillation circuit using this crystal blank, in this container body as a single unit. More particularly, the present invention relates to a crystal oscillator for surface mounting which is provided with a monitoring electrode on a bottom surface of the one recess of the container body in which the IC chip is accommodated.

BACKGROUND ART

Crystal oscillators for surface mounting using a surface-mount type container for surface mounting and accommodating a crystal blank and an IC (integrated circuit) chip, which has an oscillation circuit using this crystal blank, in the container configured as a single unit are small and light, and are therefore widely used especially as frequency and time reference sources in portable electronic devices represented by cellular phones.

As one type of crystal oscillator for surface mounting, there is one using a container body having an H-figured cross section, on both principal surfaces of which recesses are formed, accommodating a crystal blank in the one recess and accommodating an IC chip on the other recess. FIGS. 1A and 1B are a cross-sectional view and a bottom view, respectively, showing the configuration of such a conventional crystal oscillator for surface mounting.

The crystal oscillator for surface mounting illustrated here is provided with container body 1 made of, for example, laminated ceramics. On one principal surface of container body 1, first recess 1a is formed, and on the other principal surface of container body 1, second recess 1b is formed. In container body 1, crystal blank 2 is accommodated in first recess 1a and IC chip 3 is accommodated in second recess 1b. Crystal blank 2 is, for example, an AT-cut quartz crystal blank, on both principal surfaces of which excitation electrodes (not shown) are formed, respectively. In crystal blank 2, lead-out electrodes extend from a pair of excitation electrodes toward both sides of one end of crystal blank 2, respectively. Both sides of one end of crystal blank 2 to which the lead-out electrodes extend are fixed to a pair of crystal holding terminals 4 provided on the bottom surface of first recess 1a of container body 1 using conductive adhesive 5. This causes crystal blank 2 to be held horizontally within recess 1a. Metal ring 6 is provided at an opened end face of recess 1a and by bonding metal cover 7 to metal ring 6 through seam welding, crystal blank 2 is hermetically encapsulated within first recess 1a.

IC chip 3 is made up of electronic circuits integrated on a semiconductor substrate, the electronic circuits including an oscillation circuit using crystal blank 2. On the bottom surface of second recess 1b of container body 1, there are provided a plurality of mounting electrodes 9 to which a plurality of IC terminals 8 of IC chip 3 are fixed, respectively, and IC chip 3 is fixed to the bottom surface of second recess 1b through flip-chip bonding which bonds corresponding IC terminals 8 and mounting electrodes 9 together by means of bumps 10. In IC chip 3, since electronic circuits are formed on one principal surface of the semiconductor substrate, this principal surface is called a "circuit forming surface" of IC chip 3.

The plurality of IC terminals 8 are provided on the circuit forming surface which is the surface on which IC chip 3 is bonded to container body 1. These IC terminals 8 include: a pair of crystal terminals 8a and 8b used for electrical connection between IC chip 3 and crystal blank 2; a power supply terminal; an output terminal; a grounding terminal; and an AFC (automatic frequency control) terminal. In the example shown here, there are further provided two independent writing terminals as IC terminals used to write temperature compensation data into IC chip 3. These IC terminals 8 are electrically connected to the electronic circuits within IC chip 3 and are provided along a pair of mutually facing sides, for example, in the lengthwise direction on the substantially rectangular circuit forming surface. Especially, crystal terminals 8a and 8b are connected to the oscillation circuit within IC chip 3 and in this way, an oscillation closed loop made up of the oscillation circuit and crystal blank 2 is formed. Of IC terminals 8, the power supply terminal and grounding terminal are used to supply electric power to the oscillation circuit and the AFC terminal is used to supply an AFC signal to the oscillation circuit. Oscillation output fout from the oscillation circuit appears at the output terminal in IC chip 3. For explanations, FIG. 1B shows the outline of IC chip 3 with a dotted line and also shows IC terminals 8 and mounting electrodes 9 hidden by IC chip 3 and further shows monitoring electrodes 12a and 12b which will be described later. Therefore, the dotted line in FIG. 1B shows a region in second recess 1b in which IC chip 3 is placed.

Mounting electrodes 9 are all formed as substantially rectangular, flat-shaped electrode layers and are formed facing respective IC terminals 8 of IC chip 3 and arranged in parallel along the longitudinal direction of substantially rectangular second recess 1b of container body 1. In the figure, four mounting electrodes 9 are arranged on a row near each long side of recess 1b. Of these mounting electrodes 9, mounting electrodes 9a and 9b to be bonded to crystal terminals 8a and 8b by means of bumps 10 are electrically connected to a pair of crystal holding terminals 4 provided on the bottom surface of first recess 1a via conductive paths including via holes (not shown) provided in container body 1. Other mounting electrodes 9 connected to IC terminals 8 such as the power supply terminal, output terminal and grounding terminal are electrically connected to external terminals 11 which are provided in the four corners of the end face surrounding second recess 1b of container body 1, that is, the outer bottom surface of container body 1. External terminals 11 are the terminals used to surface-mount this crystal oscillator for surface mounting on a wiring board. Furthermore, mounting electrodes 9 connected to the writing terminals are electrically connected to external terminals (not shown) for data writing provided on the outer side surface of container body 1.

In addition to mounting electrodes 9, a pair of monitoring electrodes 12a and 12b used for characteristic testing of crystal blank 2 as a crystal element are also provided on the inner bottom surface of second recess 1b of container body 1. Monitoring electrodes 12a and 12b extend from mounting electrodes 9a and 9b connected to crystal terminals 8a and 8b on IC chip 3 side and are provided in a central region of the inner bottom surface of second recess 1b, that is, within the region to be covered with IC chip 3. In the figure, of mounting electrodes 9 arranged in two rows, second mounting electrodes 9 counted from the positions of both ends on one side of a diagonal of second recess 1*b* for the respective rows of mounting electrodes 9 are mounting electrodes 9*a* and 9*b* to be connected to crystal terminals 8*a* and 8*b*, respectively. These two mounting electrodes 9*a* and 9*b* and monitoring electrodes 12*a* and 12*b* are electrically connected by elongated conductive patterns 12*c* and 12*d* formed on the bottom surface of recess 1*b*. Monitoring electrodes 12*a* and 12*b* are substantially rectangular and have the areas greater than the areas of mounting electrodes 9, 9*a* and 9*b* to make it easier to contact a probe of a jig connected to a measuring instrument (not shown) with monitoring electrodes 12*a* and 12*b*.

Monitoring electrodes 12*a* and 12*b* are used to judge defective products in the manufacturing process of crystal oscillators. More specifically, after hermetically encapsulating crystal blank 2 within first recess 1*a* of container body 1 and before accommodating IC chip 3 in second recess 1*b*, the probe is made to contact monitoring electrodes 12*a* and 12*b* to thereby test the oscillation characteristic of crystal blank 2 as a crystal element and separate conforming products from non-conforming products. IC chips are mounted on only products judged as conforming products in a later process.

Furthermore, monitoring electrodes 12*a* and 12*b* can also be used to adjust the vibration frequency of crystal blank 2. In such a case, before bonding metal cover 7 to metal ring 6, in the state that crystal blank 2 is fixed to crystal holding terminals 4 and, for example, the oscillation frequency of crystal blank 2 is adjusted by irradiating an ion beam onto crystal blank 2 while monitoring the vibration frequency of crystal blank 2 via monitoring electrodes 12*a* and 12*b*.

In order to protect the circuit forming surface of the IC chip, protective resin is generally injected, as so-called underfill, between the IC chip and the bottom surface of the recess in which the IC chip is accommodated in a crystal oscillator in a configuration with the crystal blank and IC chip accommodated in different recesses of the container body.

Japanese Patent Laid-Open No. 2000-49560 (JP, 2000-049560, A) describes that monitoring electrodes are provided only within a region in which an IC chip is placed, that is, at a position below the IC chip, the monitoring electrodes are thereby electrically shielded by a grounding potential plane within the IC chip and it is thereby possible to prevent stray capacitance from being generated between the wiring pattern of the wiring board on which a crystal oscillator for surface mounting is mounted and the crystal blank.

In the crystal oscillator for surface mounting in the above described configuration, on the bottom surface of second recess 1*b*, monitoring electrodes 12*a* and 12*b* are drawn through conductive patterns 12*c* and 12*d* from mounting electrodes 9*a* and 9*b*, which correspond to crystal terminals 8*a* and 8*b* of IC chip 3, and provided within the region in which IC chip 3 is placed, that is, in the region between the two rows of mounting electrodes 9. IC chip 3 is fixed to the bottom surface of second recess 1*b* through flip-chip bonding in such a way that the circuit forming surface thereof faces monitoring electrodes 12*a* and 12*b*.

As a result, stray capacitance C01 is generated between the circuit forming surface of IC chip 3, particularly a high-frequency circuit part such as the oscillation circuit in IC chip 3, and monitoring electrodes 12*a* and 12*b*, as shown in FIG. 2. In this case, the value of stray capacitance C01 is added up with a contribution of the extending path from mounting electrode 5, that is, conductive patterns 12*c* and 12*d* to monitoring electrodes 12*a* and 12*b*, and a contribution of the areas of mounting electrodes 9*a* and 9*b*. If the areas of conductive patterns 12*c* and 12*d* are sufficiently smaller than the areas of the electrodes, stray capacitance C01 results from the total area of monitoring electrodes 12*a* and 12*b* and mounting electrodes 9*a* and 9*b*.

Furthermore, on the bottom surface of second recess 1*b* of container body 1, there are a plurality of mounting terminals 9 in addition to mounting electrodes 9*a* and 9*b* to which crystal terminals 8*a* and 8*b* are bonded, and each of monitoring electrodes 12*a* and 12*b* is surrounded by three of these mounting electrodes 9 on the bottom surface of second recess 1*b*. Since these mounting electrodes 9 other than mounting electrodes 9*a* and 9*b* are also electrically connected to the circuits in IC chip 3, stray capacitance C01 is further added up with a contribution of stray capacitance produced between monitoring electrodes 12*a* and 12*b* and these mounting electrodes 9. Moreover, stray capacitance C02 is also produced between monitoring electrodes 12*a* and 12*b*.

Therefore, as shown in FIG. 2, a closed loop without routing through the crystal element (i.e., crystal blank 2) is formed with stray capacitances C01 and C02 independently of the original oscillation closed loop made up of the crystal element and oscillation circuit within IC chip 3. FIG. 2 shows such an additional closed loop with dotted lines. As a result, a high-frequency current i' is produced which passes through the additional closed loop but not through the crystal element, and this current i' is mixed up with oscillation current i in the original oscillation closed loop and outputted from output terminal fout of IC chip 3. The high-frequency signal outputted in such a way is liable to contain noise. Monitoring electrodes 12*a* and 12*b* accompanying stray capacitances C01 and C02 can thus constitute factors of deteriorating an operating characteristic of the crystal oscillator, for example, phase noise characteristic.

On the bottom surface of second recess 1*b*, monitoring electrodes 12*a* and 12*b* are provided in the region in which IC chip 3 is placed independently of mounting electrodes 9*a* and 9*b*, and therefore the sizes of monitoring electrodes 12*a* and 12*b* are restricted depending on the size of IC chip 3. As the crystal oscillator for surface mounting becomes more compact, the size of IC chip 3 is also reduced, and therefore the areas of monitoring electrodes 12*a* and 12*b* need to be reduced, too. For example, as for the planer outside size of the crystal oscillator, an already established standard size of 2.5× 2.0 mm or 2.0×1.6 mm is available and in such a case, the inside size of the bottom surfaces of the recesses of the container body are on the order of 1.85×1.45 mm or 1.45×1.20 mm. In this way, as the size of the crystal oscillator is reduced, the areas of monitoring electrodes 12*a* and 12*b* are also reduced, and it becomes more difficult to make the probe touch or contact monitoring electrodes 12*a* and 12*b*.

SUMMARY OF THE INVENTION

It is an object of the present invention to provide a crystal oscillator for surface mounting which has a good phase noise characteristic capable of suppressing the generation of noise and is provided with monitoring electrodes having large areas so as to make a probe reliably contact the monitoring electrodes.

The object of the present invention can be attained by a crystal oscillator for surface mounting including: a container body having a first recess on one principal surface thereof and a second recess on the other principal surface thereof; a crystal blank accommodated and hermetically encapsulated within the first recess; and an IC chip in which electronic circuits including at least an oscillation circuit using the crystal blank are integrated; the IC chip being accommodated within the second recess by being fixed thereto through flip chip bonding, wherein the IC chip is provided with a plurality of IC terminals connected to the electronic circuits, the IC terminal including a pair of crystal terminals used for electrical connection with the crystal blank, a plurality of mounting electrodes to which the IC terminals are connected through flip-chip bonding are formed on a bottom surface of the second recess in correspondence with the IC terminals, and a pair of mounting electrodes corresponding to the pair of crystal terminals out of the plurality of mounting electrodes are electrically connected to the crystal blank and also formed as a pair of dual-purpose electrodes having greater areas than those of the other mounting electrodes not corresponding to the crystal terminals. In the crystal oscillator of the present invention, the dual-purpose electrode is configured so as to be also used, for example, as a monitoring electrode for testing an oscillation characteristic of the crystal blank.

In this configuration, among the mounting electrodes, the mounting electrodes to which the pair of crystal terminals of the IC terminals are to be bonded have greater areas to serve as dual-purpose electrodes, and since the dual-purpose electrode can also be used as a monitoring electrode, there is no need to form a separate monitoring electrode aside from the mounting electrode. Therefore, when the IC chip is fixed to the bottom surface of the second recess through flip-chip bonding, the facing area between the circuit forming surface of the IC chip and the monitoring electrodes can be reduced by approximately the area corresponding to the mounting electrodes compared to that of the related art. The dual-purpose electrode basically produces stray capacitance only between the dual-purpose electrode and neighboring mounting electrodes, and it is thereby possible to reduce the number of locations in which stray capacitance can be generated compared to the case where an independent monitoring electrode is provided in the arrangement region of the IC chip as in the case of the conventional crystal oscillator. Therefore, the crystal oscillator for surface mounting according to the present invention can suppress the intrusion of noise components at the oscillation output and obtain a good phase noise characteristic.

In this configuration, the dual-purpose electrode has a greater area, and can thereby make the probe reliably contact the dual-purpose electrode. For example, even if the position of the probe is deviated outward from the center of the dual-purpose electrode, the probe can be made to contact the electrode and establish reliable electrical contact.

In the present invention, the dual-purpose electrode may be formed, for example, so as to protrude from within the arrangement region of the IC chip on the bottom surface of the second recess toward the outside of the region. According to such a configuration, since the dual-purpose electrode deviates from the central region of the IC chip by the amount of protrusion toward the outside of the arrangement region of the IC chip, stray capacitance between the dual-purpose electrode and the circuit forming surface of the IC chip is reduced. In this case, the dual-purpose electrode is preferably arranged in correspondence with a corner of the arrangement region of the IC chip. By arranging the dual-purpose electrode in correspondence with the corner of the arrangement region of the IC chip, the dual-purpose electrode protrudes from the inside to the outside of the arrangement region of the IC chip in at least one of the width direction and longitudinal direction, and it is thereby possible to further increase the electrode area of the dual-purpose electrode. In this case, when the dual-purpose electrodes are formed in a pair of diagonal corners on the bottom surface of the second recess, the distance between the dual-purpose electrodes becomes a maximum and it is thereby possible to reduce stray capacitance between the dual-purpose electrodes to a minimum, reduce the facing areas between the dual-purpose electrodes and the circuit forming surface of the IC chip and reduce stray capacitances between the dual-purpose electrodes and the IC chip.

According to the present invention, the pair of dual-purpose electrodes can be provided, for example, in correspondence with a pair of opposing sides of the arrangement region of the IC chip, respectively. According to this configuration, compared to the case where the monitoring electrodes are formed in the region sandwiched between the rows of the mounting electrodes in the arrangement region of the IC chip, it is possible to increase the distance between the dual-purpose electrodes and reduce stray capacitance therebetween. Furthermore, the present invention allows the dual-purpose electrodes to be arranged in such a way that the central positions of the dual-purpose electrodes do not confront each other in a direction perpendicular to the pair of opposing sides. Such a configuration reduces the region in which the dual-purpose electrodes face each other between the pair of opposing sides, and can thereby further reduce stray capacitance between the dual-purpose electrodes.

According to the present invention, in the crystal oscillator for surface mounting, it is possible to reduce stray capacitance to suppress the generation of noise, improve the phase noise characteristic, substantially increase the areas of the monitoring electrodes which come into contact with the probe and make the probe reliably contact the monitoring electrodes.

MODE FOR CARRYING OUT THE INVENTION

First Embodiment

Figure 1A:
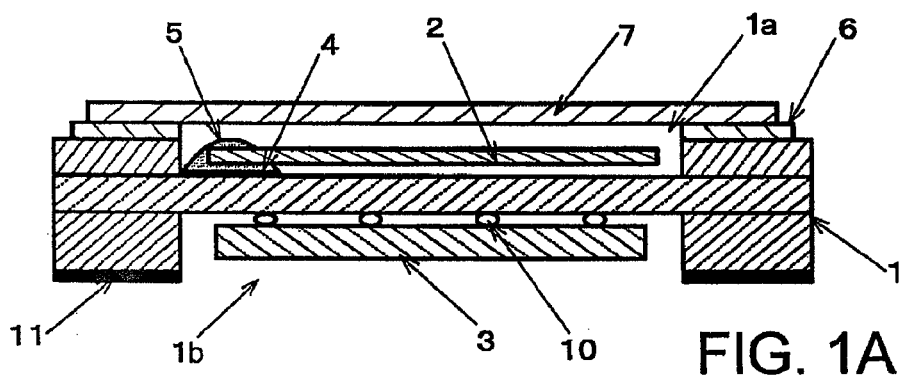
FIG. 1A is a cross-sectional view showing an example of the configuration of a conventional crystal oscillator for surface mounting.
Figure 1B:
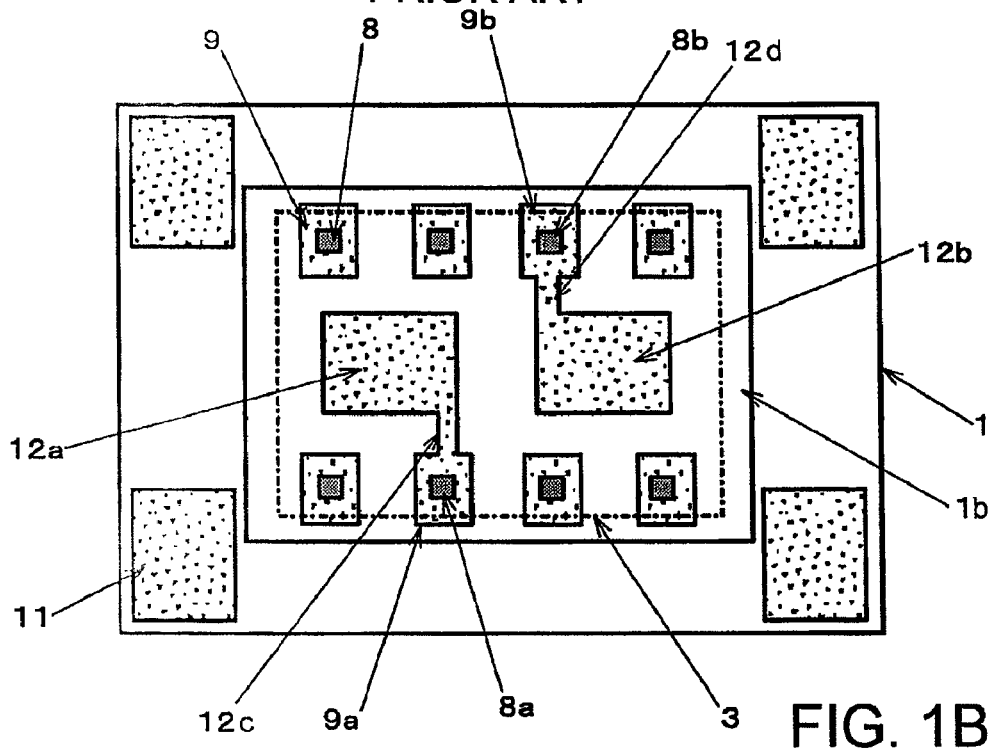
FIG. 1B is a bottom view of the crystal oscillator shown in FIG. 1A.
Figure 3A:
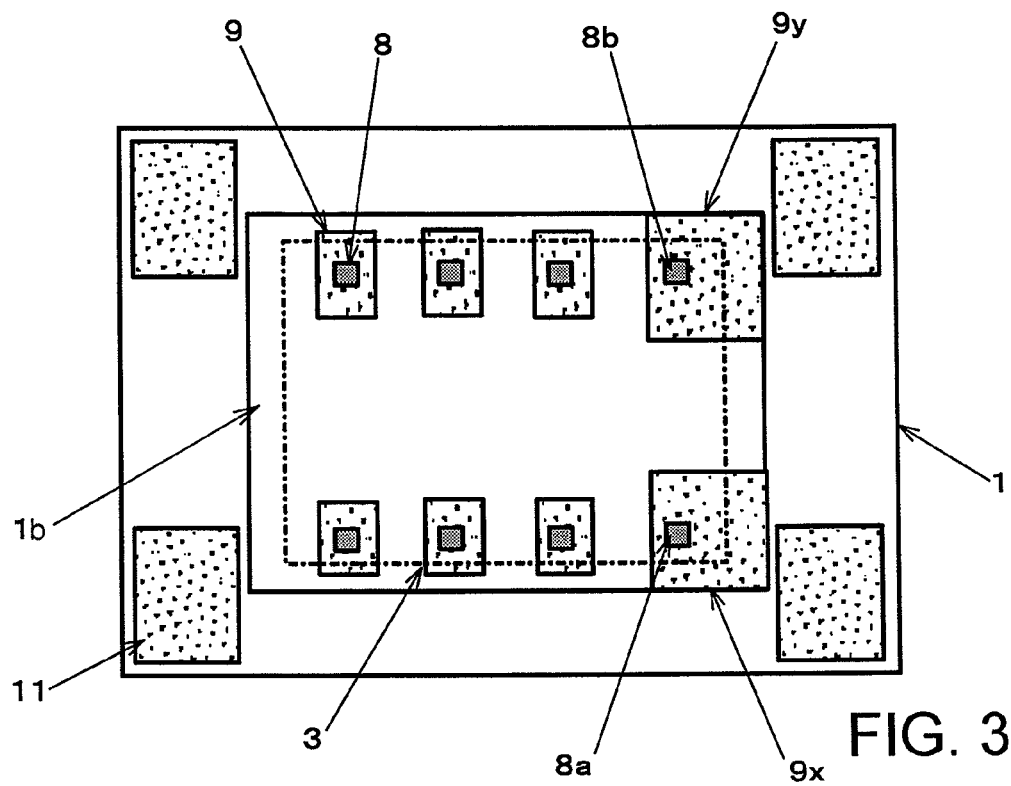
FIG. 3A is a bottom view of a crystal oscillator for surface mounting according to a first embodiment of the present invention.

In FIG. 3A showing an example of a crystal oscillator for surface mounting according to a first embodiment of the present invention, the same constituents as those in FIGS. 1A and 1B are assigned the same reference numerals and redundant explanations will be omitted or simplified.

Like the one shown in FIGS. 1A and 1B, the crystal oscillator for surface mounting shown in FIG. 3A uses container body 1, one principal surface of which is provided with first recess 1a and the other principal surface of which is provided with second recess 1b. Crystal blank 2 is accommodated and hermetically encapsulated in first recess 1a, and IC chip 3 is accommodated in second recess 1b. For the purpose of explanations, FIG. 3A and subsequent figures show the outline of IC chip 3 with IC chip 3 accommodated in second recess 1b of container body 1 with a dotted line; show IC terminals 8 and mounting electrodes 9 which are originally hidden behind IC chip 3 and not visible from outside; and also show dual-purpose electrodes 9x and 9y, which are partially hidden behind IC chip 3 and which will be described later. The crystal oscillator shown in FIG. 3A is similar to that shown in FIGS. 1A and 1B, but is different from that shown in FIGS. 1A and 1B in dual-purpose electrodes 9x and 9y provided instead of the monitoring electrodes and the locations of crystal terminals 8a and 8b in IC chip 3.

In the same way as the above described one, IC chip 3 integrates electronic circuits such as an oscillation circuit using crystal blank 2 on a semiconductor substrate and is provided with a plurality of IC terminals 8. IC terminals 8 include a power supply terminal, an output terminal, a grounding terminal and an AFC terminal in addition to the pair of crystal terminals 8a and 8b, and further include two writing terminals. Such a plurality of IC terminals 8 are arranged on both long sides of the circuit forming surface of IC chip 3 whose flat shape is substantially rectangular, four terminals on each side. Especially, the pair of crystal terminals 8a and 8b are provided on both sides of one end in the longitudinal direction of IC chip 3.

A plurality of mounting electrodes 9 are formed on the bottom surface of second recess 1b of container body 1 in correspondence with IC terminals 8. The mounting electrodes corresponding to crystal terminals 8a and 8b of IC chip 3 are defined as dual-purpose electrodes 9x and 9y, and are formed so as to have greater areas than other mounting electrodes 9. Dual-purpose electrodes 9x and 9y have a substantially rectangular shape and are provided in the corners on both sides of one end of the bottom surface of recess 1b in correspondence with the positions at which crystal terminals 8a and 8b are formed. The region enclosed by the dotted line in the figure shows the arrangement region in which IC chip 3 is mounted, and dual-purpose electrodes 9x and 9y are formed so as to protrude from the inside to the outside of the arrangement region of IC chip 3 in both the width direction (horizontal direction in the figure) and the longitudinal direction (vertical direction in the figure). Such dual-purpose electrodes 9x and 9y are provided with the function as the mounting electrodes used for bonding with crystal terminals 8a and 8b through flip-chip bonding and also provided with the function as monitoring electrodes with which the probe of a testing instrument comes into contact from outside. Therefore, elongated conductive patterns 12c and 12d provided to electrically connect mounting electrodes 9a and 9b and monitoring electrodes 12a and 12b in the crystal oscillator shown in FIG. 1B are not provided on the crystal oscillator shown in FIG. 3A.

Explaining more specifically using numerical values, suppose container body 1 has a planer outside size of 2.5×2.0 mm and the bottom surface of second recess 1b has an inner size of 1.85×1.45 mm. The size of dual-purpose electrodes 9x and 9y is, for example, 0.52×0.51 mm and the size of other mounting electrodes 9 except the dual-purpose electrodes is, for example, 0.14×0.25 mm.

When manufacturing such a crystal oscillator, crystal blank 2 is hermetically sealed within first recess 1a of container body 1 first, a testing probe is then made to contact dual-purpose electrodes 9x and 9y exposed on the bottom surface of second recess 1b of container body 1 and the vibration characteristic of crystal blank 2 as a crystal element is tested. Products satisfying the standard for the vibration characteristic are screened as conforming products, and for the screened products, respective IC terminals 8 (including crystal terminals 8a and 8b) of IC chip 3 are then bonded to corresponding mounting electrodes 9 (including dual-purpose electrodes 9x and 9y) through flip-chip bonding using bumps 10 (see FIG. 1A) thereby fixing IC chip 3 to container body 1.

In this way, according to this embodiment, mounting electrodes 9a and 9b and monitoring electrodes 12a and 12b, which are conventionally arranged separately, are united into dual-purpose electrodes 9x and 9y. Therefore, if the area necessary for contact with the probe is assumed to be the same, the areas of dual-purpose electrodes 9x and 9y in this embodiment can be reduced by the amount corresponding to the areas of mounting electrodes 9a and 9b compared to the sum of the areas of mounting electrodes 9a and 9b and the areas of monitoring electrodes 12a and 12b of the conventional crystal oscillator shown in FIGS. 1A and 1B. Since the pair of crystal terminals 8a and 8b are arranged in the corners of IC chip 3, and in this way, dual-purpose electrodes 9x and 9y are also arranged in correspondence with the corner positions of IC chip 3, and it is thereby possible to avoid the central region of IC chip 3 in which circuits such as the oscillation circuit are integrated from being arranged so as to face dual-purpose electrodes 9x and 9y. Furthermore, since dual-purpose electrodes 9x and 9y can be formed so as to protrude from the arrangement region of IC chip 3 toward the outside in the width direction of IC chip 3, it is possible to increase the distance between dual-purpose electrodes 9x and 9y compared to the case where dual-purpose electrodes 9x and 9y are formed, For example, into the same size and same shape in the arrangement region of IC chip 3.

Therefore, compared to the conventional crystal oscillator shown in FIGS. 1A and 1B having monitoring electrodes 12a and 12b provided in the central region of the bottom surface of recess 1b, the crystal oscillator for surface mounting according to the present embodiment can reduce stray capacitance C01 (see FIG. 2) between IC chip 3 and dual-purpose electrodes 9x and 9y and also reduce stray capacitance C02 between dual-purpose electrodes 9x and 9y. Moreover, since there is only one of other mounting electrodes 9 adjoins each of dual-purpose electrodes 9x and 9y, the number of locations where stray capacitances may be generated can be reduced.

Since the crystal oscillator according to the present embodiment has a small stray capacitance, high-frequency current i' in the additional closed loop generated aside from the original oscillation closed loop made up of crystal blank 2 and the oscillation circuit in IC chip 3 can be suppressed. Therefore, oscillation output with fewer noise components can be obtained from this crystal oscillator and a good phase noise characteristic can be obtained. Since dual-purpose electrodes 9x and 9y to which the pair of crystal terminals 8a and 8b are bonded are formed at positions of the corners which are both sides of one end of the bottom surface of second recess 1b of container body 1 so as to be greater in size than mounting electrodes 9 other than dual-purpose electrodes 9x and 9y, it is possible to make the probe of a jig connected to a measuring instrument reliably contact dual-purpose electrodes 9x and 9y and form reliable electrical connection between the probe and dual-purpose electrodes 9x and 9y.

Figure 3B:
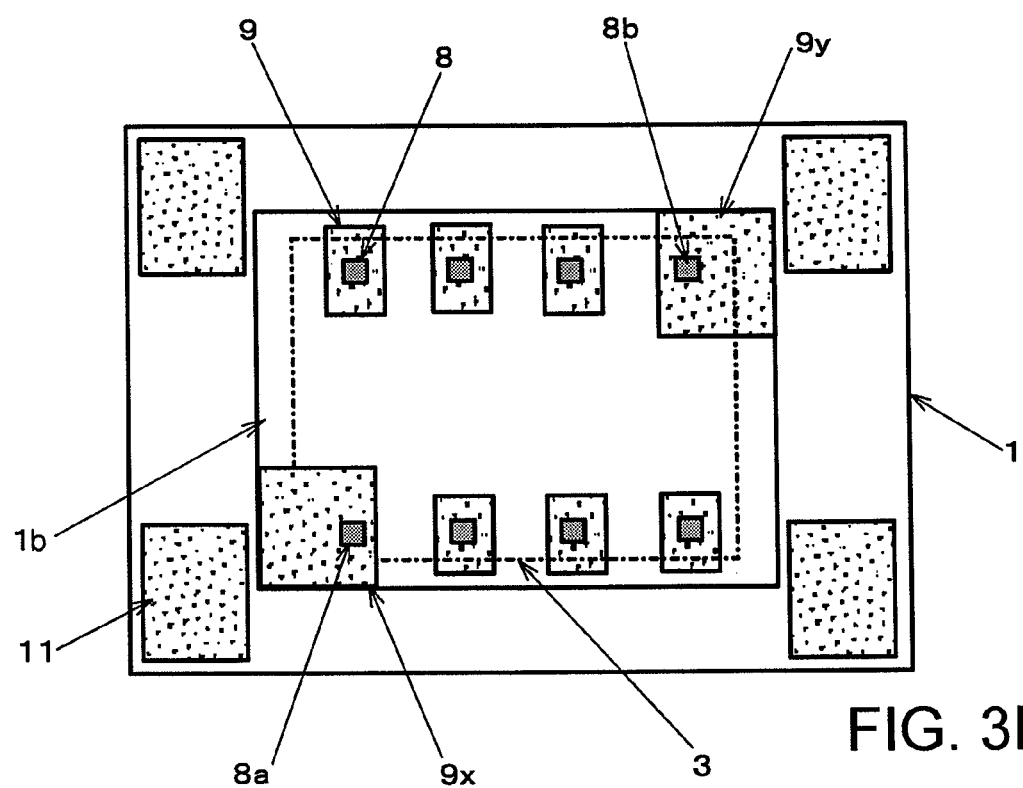
FIG. 3B is a bottom view of another example of the crystal oscillator according to the first embodiment.

In the example shown in FIG. 3A, dual-purpose electrodes 9x and 9y to which crystal terminals 8a and 8b are bonded are provided on both sides of one end of the bottom surface of second recess 1b, but the crystal oscillator according to the present embodiment is not limited to this. For example, as shown in FIG. 3B, a pair of crystal terminals 8a and 8b may be provided at positions corresponding to both ends of one diagonal of substantially rectangular IC chip 3 and dual-purpose electrodes 9x and 9y may be provided in the corners corresponding to both ends of the same one diagonal on the bottom surface of recess 1b accordingly. In this case, the distance between dual-purpose electrodes 9x and 9y becomes a maximum, and therefore the effect of reducing stray capacitance C02 and the effect of making the probe easily contact the electrodes also increase.

In the above explanations, dual-purpose electrodes 9x and 9y are formed on the bottom surface of second recess 1b of container body 1 so as to protrude from the arrangement region of IC chip 3 toward the outside, but the configuration of the present invention is not limited to this. Even when dual-purpose electrodes 9x and 9y are formed so as to be confined within the arrangement region of IC chip 3, if the areas of dual-purpose electrodes 9x and 9y are greater than the areas of other mounting electrodes 9, the effect of the present invention can be achieved. When dual-purpose electrodes 9x and 9y are formed so as to be confined within the arrangement region of IC chip 3, the areas of dual-purpose electrodes 9x and 9y can be reduced compared to the case where dual-purpose electrodes 9x and 9y are formed so as to spread outside the arrangement region of IC chip 3 and the stray capacitance between the circuit forming surface of the IC chip and the dual-purpose electrodes can be reduced accordingly. Therefore, the present invention by no means excludes the case where dual-purpose electrodes 9x and 9y are formed so as to be confined within the arrangement region of IC chip 3 from the technical scope thereof. The same will apply to the following embodiments.

Second Embodiment

Figure 4A:
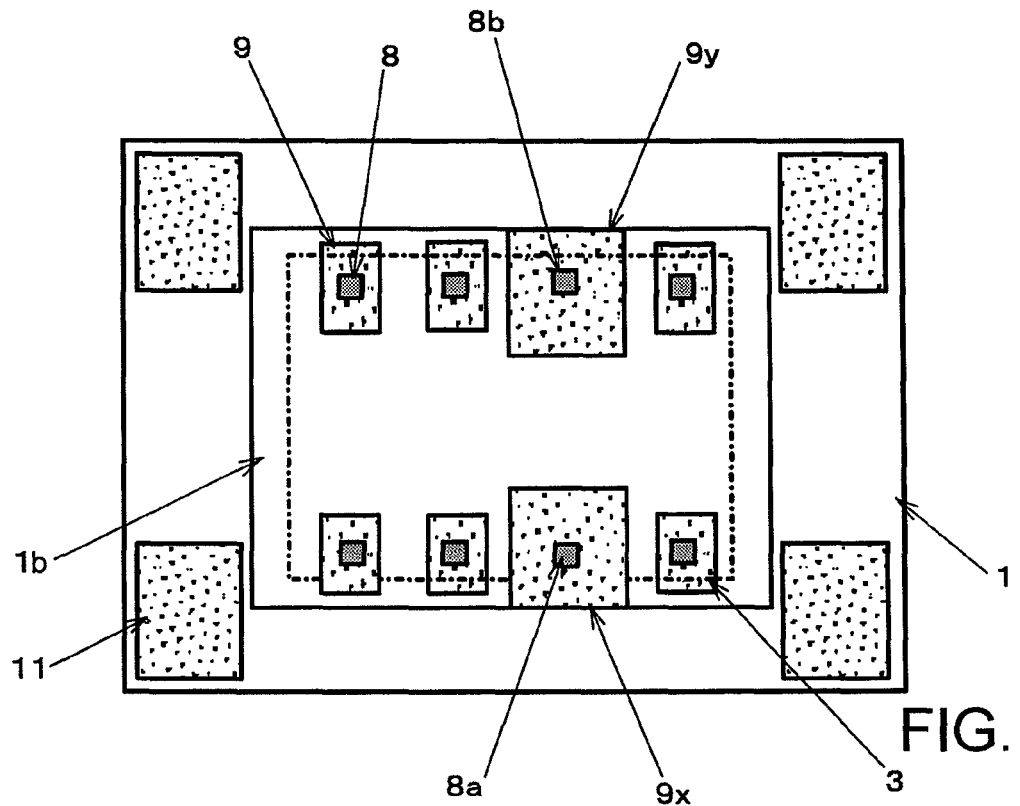
FIG. 4A is a bottom view of a crystal oscillator for surface mounting according to a second embodiment of the present invention.

In FIG. 4A showing an example of a crystal oscillator for surface mounting according to a second embodiment of the present invention, the same constituents as those in FIG. 3A are assigned the same reference numerals and redundant explanations will be omitted or simplified.

The crystal oscillator for surface mounting of according to second embodiment is similar to that of the first embodiment, but is different from the one in the first embodiment in the locations of crystal terminals 8a and 8b in IC chip 3 and the arrangement of corresponding dual-purpose electrodes 9x and 9y. The number of IC terminals 8 in IC chip 3 of the crystal oscillator of the second embodiment is eight including crystal terminals 8a and 8b in the same way as that in the first embodiment and these IC terminals 8 are arranged on two rows, four terminals on each row. However, unlike the first embodiment, in the crystal oscillator of the second embodiment, crystal terminals 8a and 8b are located at the second position counted from one end of each row of IC terminals 8. In the configuration shown in FIG. 4A, the second terminals from the right ends of the rows of IC terminals 8 correspond to crystal terminals 8a and 8b and dual-purpose electrodes 9x and 9y are formed so as to face each other on the bottom surface of recess 1b in correspondence therewith. Dual-purpose electrodes 9x and 9y have greater areas than other mounting electrodes 9 and are formed so as to protrude from the inside to the outside of the arrangement region of IC chip 3 in the width direction of IC chip 3.

In this case, the areas of dual-purpose electrodes 9x and 9y facing the circuit forming surface of IC chip 3 can also be reduced compared to the related art shown in FIGS. 1A and 1B. Since dual-purpose electrodes 9x and 9y are arranged side by side in the width direction of IC chip 3, each of dual-purpose electrodes 9x and 9y is sandwiched between two mounting electrodes 9 which are not connected to the crystal terminal. In the case of the crystal oscillator for surface mounting shown in FIG. 4A, the number of locations where stray capacitances may be generated can be reduced compared to the conventional crystal oscillator for surface mounting where each of monitoring electrodes 12a and 12b are surrounded by four mounting electrodes 9. Since dual-purpose electrodes 9x and 9y are formed so as to protrude from the opposing sides of the mounting region of IC chip 3 toward the outside of the arrangement region, it is possible to increase the distance between dual-purpose electrodes 9x and 9y and reduce a stray capacitance therebetween.

Thus, the crystal oscillator for surface mounting according to the second embodiment can prevent a noise component from mixing into the output and has a good phase noise characteristic as in the case of the first embodiment. It is possible to increase the areas of dual-purpose electrodes 9x and 9y and thereby make it easier for the probe to contact dual-purpose electrodes 9x and 9y.

Figure 4B:
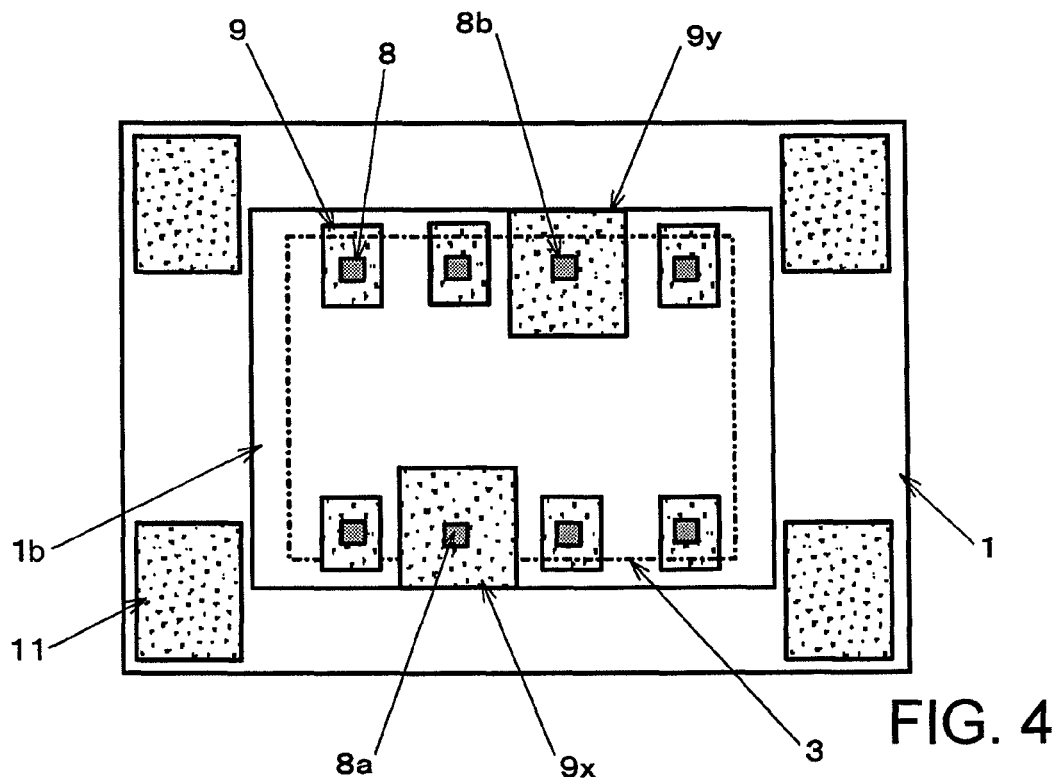
FIG. 4B is a bottom view of another example of the crystal oscillator according to the second embodiment.

The crystal oscillator for surface mounting according to the second embodiment is not limited to the configuration shown in FIG. 4A and the positions of crystal terminals 8a and 8b, that is, the positions of dual-purpose electrodes 9x and 9y can also be changed from those shown in FIG. 4A. In the configuration shown in FIG. 4B, the second terminal from the left end of the lower row in the figure is crystal terminal 8a and the third terminal from the left end of the upper row in the figure, that is, second terminal counted from the right end in the figure is crystal terminal 8b, and dual-purpose electrodes 9x and 9y are arranged in a skew or diagonal direction on the bottom surface of recess 1b. In this case, dual-purpose electrodes 9x and 9y provided on mutually opposing sides do not substantially confront each other and the distance between the respective centers further increases, and therefore a stray capacitance between dual-purpose electrodes 9x and 9y further reduces. That is, dual-purpose electrodes 9x and 9y may be arranged in such a way that the center positions of the respective dual-purpose electrodes do not confront each other in the direction perpendicular to the pair of opposing sides. In this case, it is also possible to arrange one of dual-purpose electrodes 9x and 9y at the corner of the bottom surface of recess 1b and arrange the other at the second or third position from one end of the row of mounting electrode 9.

Third Embodiment

Figure 5A:
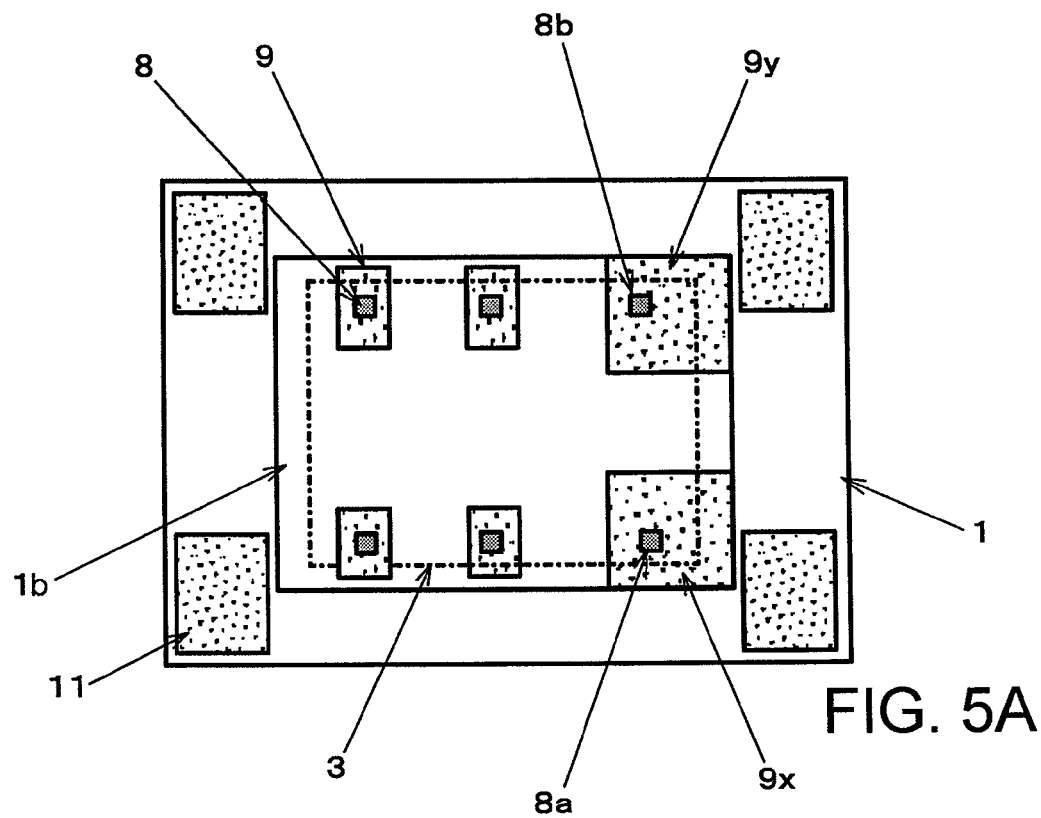
FIG. 5A is a bottom view of a crystal oscillator for surface mounting according to a third embodiment of the present invention.

In FIG. 5A showing an example of a crystal oscillator for surface mounting according to a third embodiment of the present invention, the same constituents as those in FIG. 3A are assigned the same reference numerals and redundant explanations will be omitted or simplified.

The crystal oscillator according to the third embodiment is similar to those in the first and second embodiments, but is different from those in the first and second embodiments in the number and arrangement of crystal terminals 8a and 8b in IC chip 3 and the number and arrangement of corresponding dual-purpose electrodes 9x and 9y. More specifically, IC chip 3 in the aforementioned embodiments is provided with eight IC terminals 8 including the pair of crystal terminals 8a and 8b, but IC terminals 8 provided in IC chip 3 in this third embodiment include a total of six terminals; a pair of crystal terminals 8a and 8b, a power supply terminal, an output terminal, a grounding terminal and an AFC terminal. In other words, IC chip 3 is not provided with any independent writing terminal for writing temperature compensation data. In such IC chip 3, when temperature compensation data needs to be written into the chip, the crystal oscillator may be adapted so as to enable data to be written using, for example, the power supply terminal, output terminal, grounding terminal or AFC terminal. Of course, the crystal oscillator for surface mounting of the third embodiment may also be an ordinary crystal oscillator for surface mounting instead of a temperature compensation type, and in such a case, there is no need to write temperature compensation data.

In the configuration shown in FIG. 5A, on the bottom surface of second recess 1b of container body 1, there are provided two rows of mounting electrodes 9 to which IC terminals 8 of IC chip 3 are bonded through flip-chip bonding, three electrodes on each row. Here, dual-purpose electrodes 9x and 9y to be bonded to crystal terminals 8a and 8b of IC chip 3 are formed in the corners corresponding to both sides of one end of the bottom surface of recess 1b and formed so as to protrude from the inside to the outside of the arrangement region of IC chip 3 in both the width direction and longitudinal direction in the same way as those shown in FIG. 3A.

In this case, as in the case of the first embodiment, the areas of dual-purpose electrodes 9x and 9y facing the circuit forming surface of IC chip 3 can also be reduced compared to the monitoring electrodes of the conventional crystal oscillator for surface mounting. By arranging dual-purpose electrodes 9x and 9y in the corners on both sides of one end of the bottom surface of second recess 1b, it is possible to avoid the central region in which circuits such as an oscillation circuit are integrated within IC chip 3 and dual-purpose electrodes 9x and 9y from being arranged so as to face each other and also increase the distance between dual-purpose electrodes 9x and 9y. Since the number of mounting electrodes 9 adjoining each of dual-purpose electrodes 9x and 9y is one, the number of locations in which stray capacitances can be generated is thereby reduced.

Figure 2:
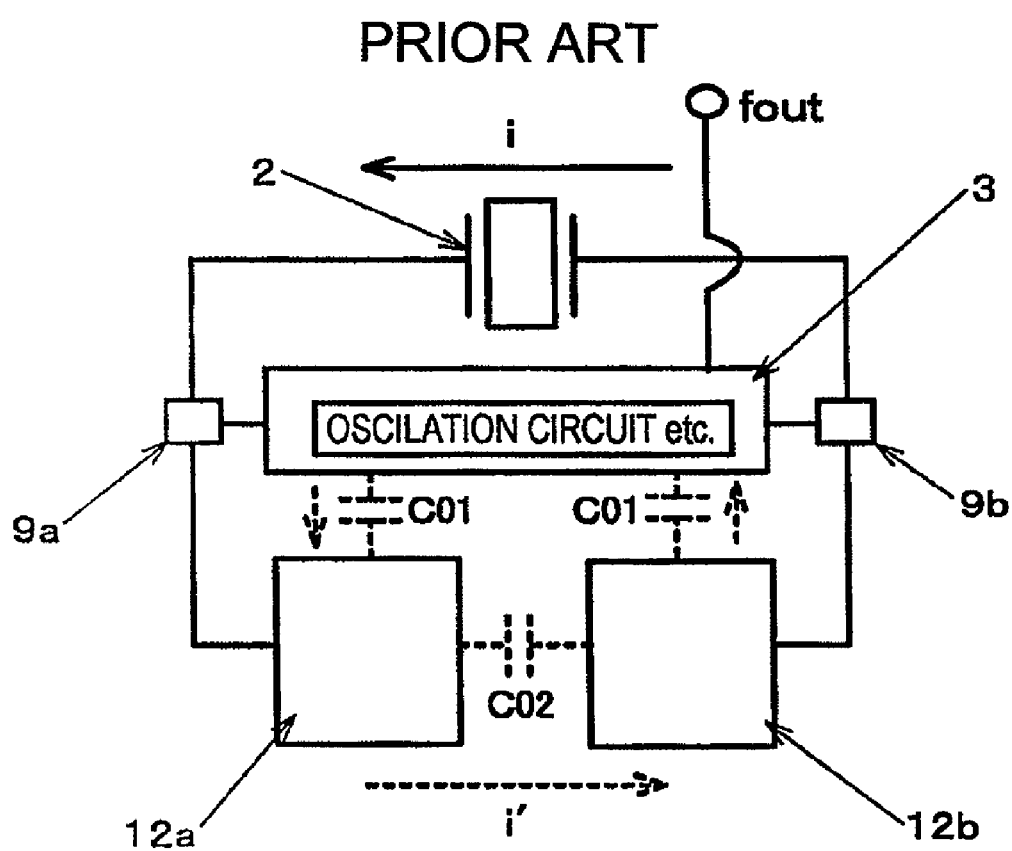
FIG. 2 is a schematic circuit diagram illustrating stray capacitances in the crystal oscillator for surface mounting.

Therefore, the crystal oscillator according to the third embodiment can also reduce stray capacitances C01 and C02 explained using FIG. 2, reduce high-frequency current i' that flows through an additional loop aside from the original oscillation closed loop and obtain a good phase noise characteristic. Since dual-purpose electrodes 9x and 9y are provided in the corners on both sides of one end of the bottom surface of recess 1b so as to protrude from each side of the arrangement region of IC chip 3, dual-purpose electrodes 9x and 9y have greater areas than other mounting electrodes 9 and allow the probe to reliably contact these electrodes.

Figure 5B:
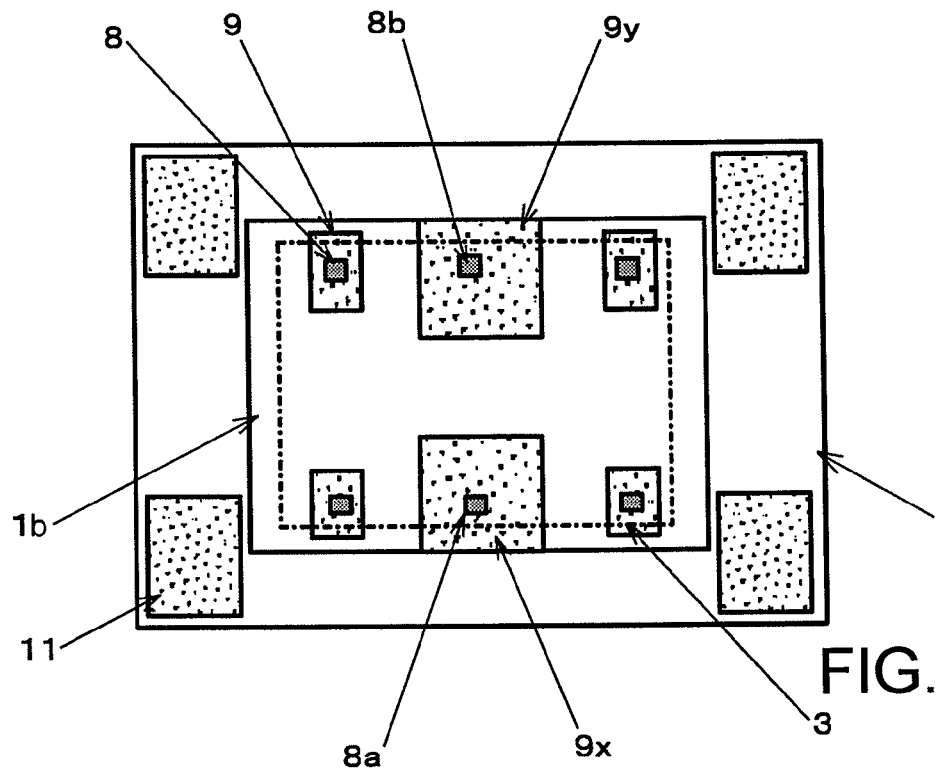
FIG. 5B is a bottom view of another example of the crystal oscillator according to the third embodiment.

In the third embodiment, the locations of crystal terminals 8a and 8b and dual-purpose electrodes 9x and 9y are not limited to those described above either. In the configuration shown in FIG. 5B, dual-purpose electrodes 9x and 9y are arranged in the center of each long side in the arrangement region of IC chip 3. Even in such an arrangement of dual-purpose electrodes 9x and 9y, there are only two mounting electrodes 9 adjoining each of dual-purpose electrodes 9x and 9y and it is possible to reduce the number of locations where stray capacitances can be generated and increase the distance between dual-purpose electrodes 9x and 9y. Therefore, the configuration shown in FIG. 5B can also reduce noise due to stray capacitances and improve the phase noise characteristic.

In this third embodiment, as in the case of the configuration shown in FIG. 3B, dual-purpose electrodes 9x and 9y may be provided in a pair of diagonal corners of the arrangement region of IC chip 3. Moreover, the center positions of the pair of dual-purpose electrodes 9x and 9y may also be arranged at different locations on the pair of sides of the arrangement region of IC chip 3.

The invention claimed is:

1. A crystal oscillator for surface mounting comprising:
   a container body having a first recess on one principal surface thereof and a second recess on the other principal surface thereof;
   a crystal blank accommodated and hermetically encapsulated within the first recess; and
   an IC chip in which electronic circuits including at least an oscillation circuit using crystal blank are integrated, the IC chip being accommodated within the second recess by being fixed thereto through flip-chip bonding,
   wherein the IC chip is provided with a plurality of IC terminals connected to the electronic circuits, the IC terminal including a pair of crystal terminals used for electrical connection with the crystal blank,
   a plurality of mounting electrodes to which the IC terminals are connected through the flip-chip bonding are formed on a bottom surface of the second recess in correspondence with the IC terminals, and
   a pair of mounting electrodes corresponding to the pair of crystal terminals out of the plurality of mounting electrodes are electrically connected to the crystal blank and also formed as a pair of dual-purpose electrodes having greater areas than those of the other mounting electrodes not corresponding to the crystal terminals,
   wherein the dual-purpose electrode is formed so as to protrude from the inside to the outside of a mounting region of the IC chip on the bottom surface of the second recess.

2. The crystal oscillator according to claim 1, wherein the pair of dual-purpose electrodes are provided in correspondence with the pair of opposing sides of the mounting region of the IC chip.

3. The crystal oscillator according to claim 2, wherein the pair of dual-purpose electrodes are arranged in such a way that center positions of the dual-purpose electrodes do not confront each other in a direction perpendicular to the pair of opposing sides.

4. The crystal oscillator according to claim 1, wherein the pair of dual-purpose electrodes are arranged in correspondence with corners of the mounting region of the IC chip.

* * * * *